United States Patent [19]

Sarma et al.

[11] 4,292,342

[45] Sep. 29, 1981

[54] HIGH PRESSURE PLASMA DEPOSITION OF SILICON

[75] Inventors: Kalluri R. Sarma; M. John Rice, Jr., both of Tempe; I. Arnold Lesk, Phoenix, all of Ariz.

[73] Assignee: Motorola, Inc., Schaumberg, Ill.

[21] Appl. No.: 148,095

[22] Filed: May 9, 1980

[51] Int. Cl.$^3$ .............................................. B05I 1/08
[52] U.S. Cl. ...................................... 427/34; 427/86
[58] Field of Search .................... 427/34, 86; 204/164; 423/350, 348

[56] References Cited

U.S. PATENT DOCUMENTS

| | | | |
|---|---|---|---|
| 3,658,673 | 4/1972 | Kugler et al. | 204/164 |
| 3,865,647 | 2/1975 | Reuschel | 423/350 |
| 4,003,770 | 1/1977 | Janowiecki et al. | 427/34 |
| 4,102,764 | 7/1978 | Harvey et al. | 204/164 |
| 4,123,989 | 11/1978 | Jewett | 427/86 |

FOREIGN PATENT DOCUMENTS 49-33004  9/1974  Japan ..................................... 427/86

*Primary Examiner*—John H. Newsome
*Attorney, Agent, or Firm*—John A. Fisher

[57] ABSTRACT

Polycrystalline silicon is deposited on the interior surface of a shaped container. The silicon is deposited by reacting hydrogen and a silicon bearing gas in the presence of a high pressure plasma. The silicon body is separated from the shaped container by utilizing thermal expansion shear stress.

10 Claims, 7 Drawing Figures

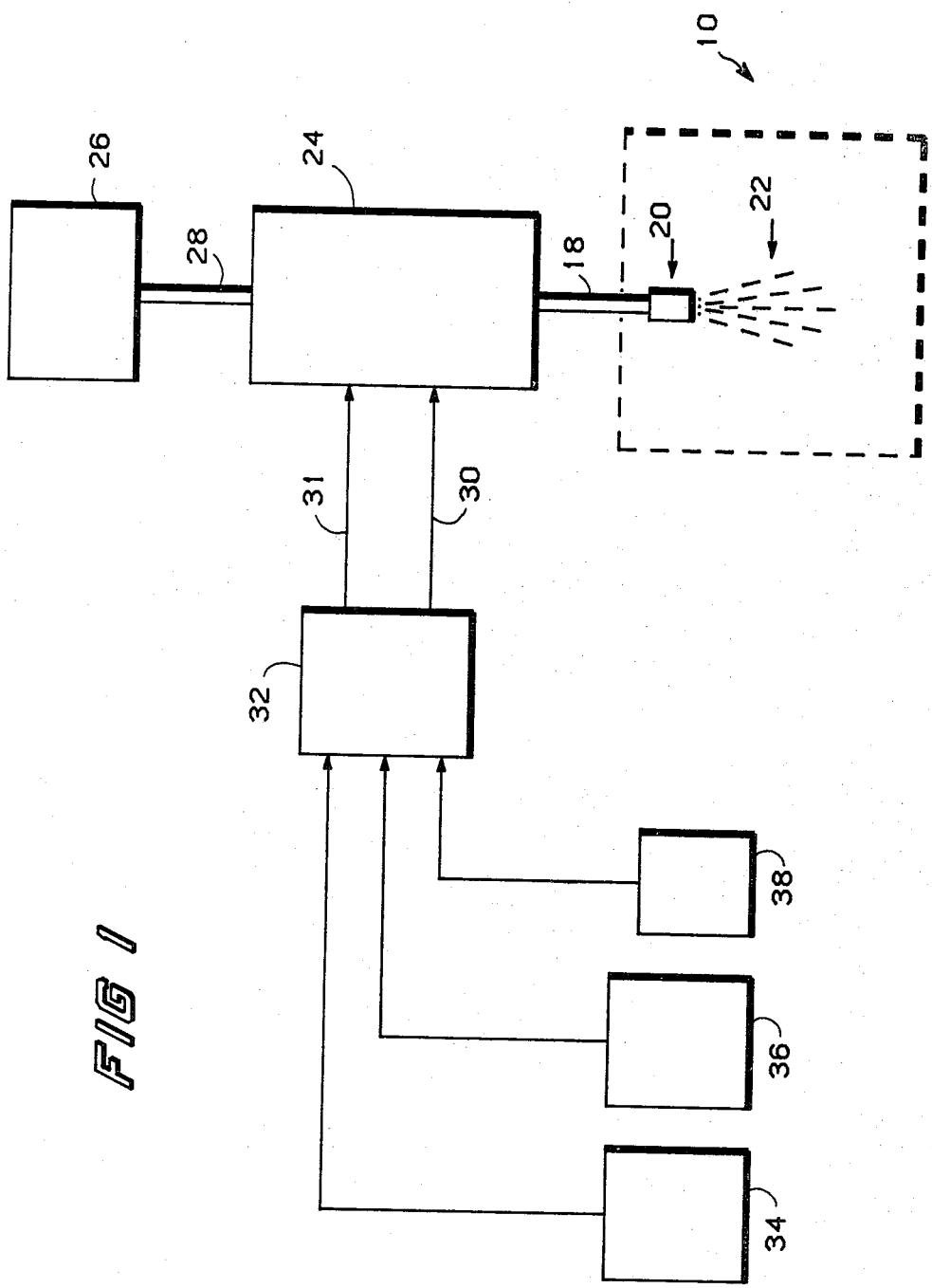

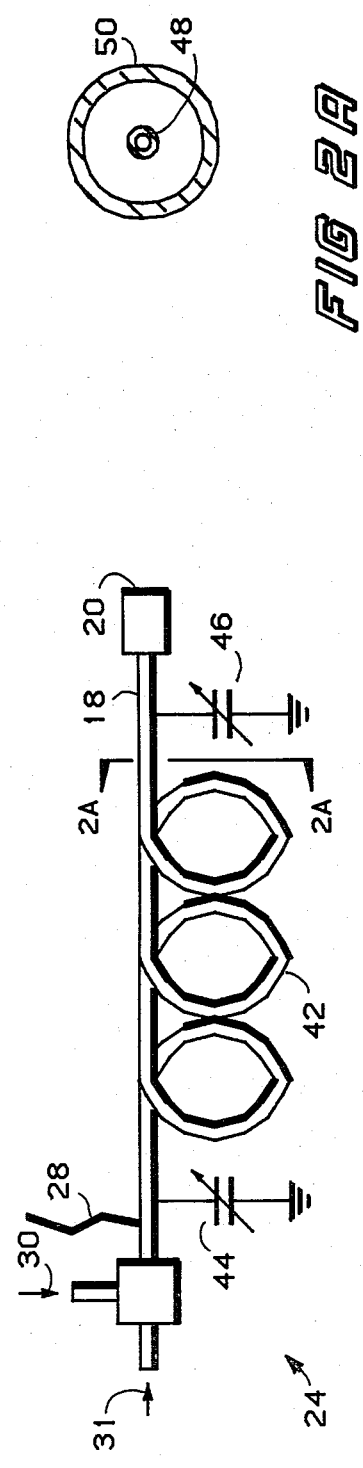
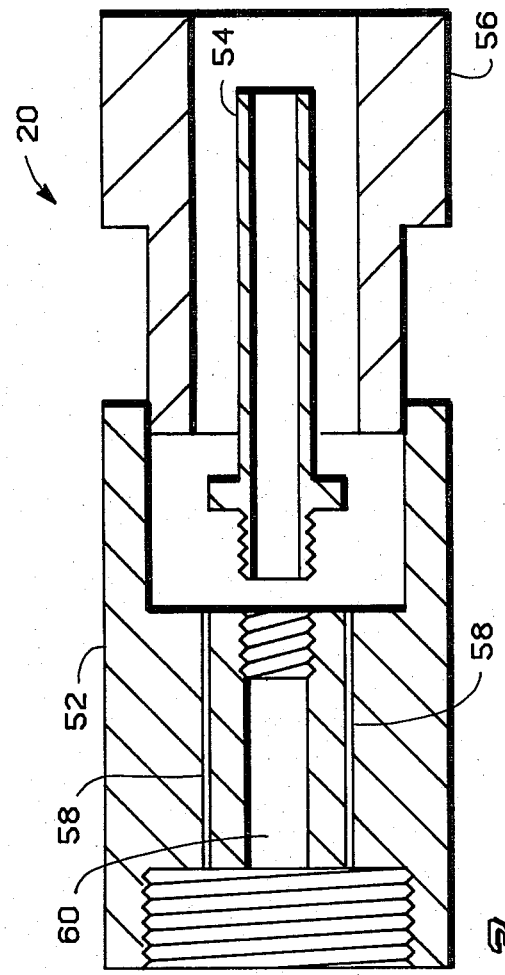
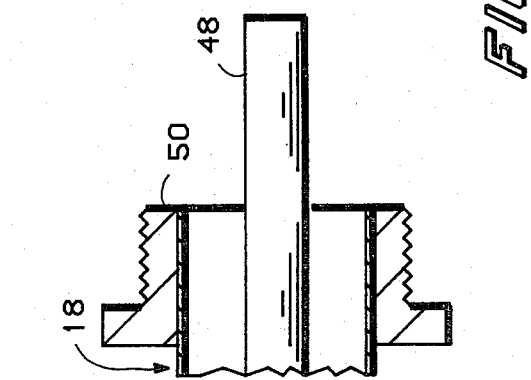

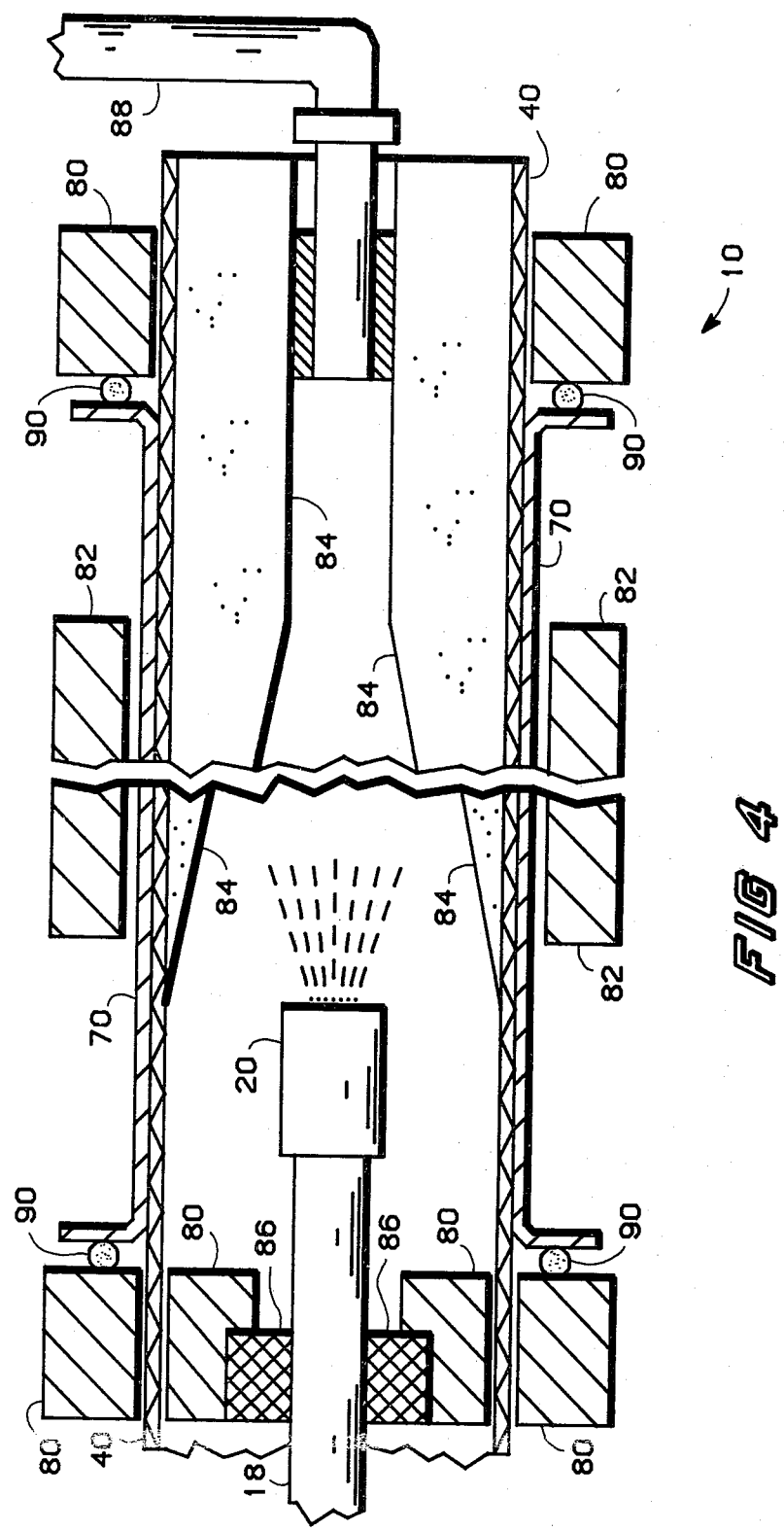

HIGH PRESSURE PLASMA DEPOSITION OF SILICON

RELATED APPLICATIONS

This application is related to the inventions disclosed and claimed in concurrently filed, copending, commonly assigned applications entitled High Pressure Plasma Hydrogenation of Silicon Tetrachloride Ser. No. 148,094 and Polycrystalline Silicon Production Ser. No. 148,093.

BACKGROUND OF THE INVENTION

This invention relates in general to the deposition of polycrystalline silicon and more particularly to the deposition of silicon from a silicon-bearing compound in the presence of a high pressure plasma.

Large quantities of high quality silicon are used by the semiconductor industry for the fabrication of transistors, integrated circuits, solar cells, and the like. The silicon must be of high purity, containing only carefully controlled amounts of conductivity determining dopants. Silicon is typically produced by the hydrogen reduction of a chlorosilane. In the typical process the chlorosilane, usually trichlorosilane, and hydrogen are reacted in a reactor apparatus to deposit pure silicon on a heated filament. The filament can be, for example, either pure silicon or a refractory metal such as tungsten or molybdenum. It is usually about one-half centimeter in diameter and is heated to about 1100° C. by the passage of a heating current. Because the small diameter of the rod provides a heated reaction area of limited size the process starts slowly and is relatively inefficient. Large volumes of gases go unreacted and must be purified for subsequent reuse. Additional large volumes of gases react to form other silicon compounds without resulting in the deposition of silicon. Large quantities of energy are expended, contributing to the high cost of the silicon produced.

A further disadvantage of the prior art process relates to the shape of the outer diameter of the polycrystalline body formed. The rate of deposition and thus the outer shape of the deposited body is partly a function of the temperature of the deposition surface. Any nonuniformities in the deposition filament will result in non-uniformity in the temperature along that filament. This will in turn cause non-uniform deposition rates along the filament and a non-uniform outer diameter.

The filament can also be a source of contaminants. The refractory metal filament can contribute small amounts of unwanted dopants to the depositing silicon at the elevated temperatures used in the deposition process. The filament itself must be bored out of the center of the polycrystalline body before that polycrystalline silicon can be used in subsequent crystal growth processes. This of course entails an additional mechanical operation which is costly and time consuming and which can contribute further contaminants to the silicon.

If a silicon filament is used rather than a refractory metal filament, the silicon must be of extremely high purity, that is, of a purity equivalent to that of the silicon being deposited. Such high purity silicon is, however, very highly resistive and thus difficult to heat uniformly by forcing a current through the filament. The high resistance makes it difficult to force the thousands of Amperes of current through the filament that are required to achieve the deposition temperature.

There is a growing need for high quality, inexpensive polycrystalline silicon resulting from the tremendous present growth in the use of semiconductor products. The availability of low-cost silicon is a necessary prerequisite if silicon photovoltaic cells are to provide an appreciable amount of the country's energy needs. But present methods for producing polycrystalline silicon are expensive, inefficient in the use of both energy and reactants, and tend to yield impure and irregularly shaped silicon deposits. Accordingly a need existed for a silicon deposition process that overcomes these deficiencies attendant with present methods.

It is therefore an object of this invention to provide an improved process for harvesting polycrystalline silicon by high pressure plasma deposition.

It is a further object of this invention to provide a process for the deposition of polycrystalline silicon having a high efficiency of input gas utilization.

It is another object of this invention to provide an improved process for the deposition of polycrystalline silicon which is characterized by lower energy consumption than are prior art processes.

It is still another object of this invention to provide a process for the deposition of high purity polycrystalline silicon in shapes having well controlled outer diameters.

SUMMARY OF THE INVENTION

The foregoing objects are achieved in the present invention through the use of a high pressure plasma deposition method. A chlorosilane or other silicon source gas is reduced by hydrogen in the presence of a high pressure plasma to deposit polycrystalline silicon on the interior wall of a heated substrate structure. The substrate material is selected to have a thermal expansion coefficient which permits separation of the polycrystalline silicon from the substrate by a thermal expansion shear separation process.

BRIEF DESCRIPTION OF THE DRAWINGS

FIG. 1 illustrates a high pressure plasma apparatus suitable for practice of the invention;

FIG. 2 illustrates a high pressure plasma module for impedance matching and for introduction of reactant gases;

FIG. 3 illustrates in exploded cross section a dual-flow nozzle for the high pressure plasma apparatus;

FIG. 4 illustrates a high pressure plasma deposition system suitable for practice of the invention;

DETAILED DESCRIPTION OF THE INVENTION

Figure 6:
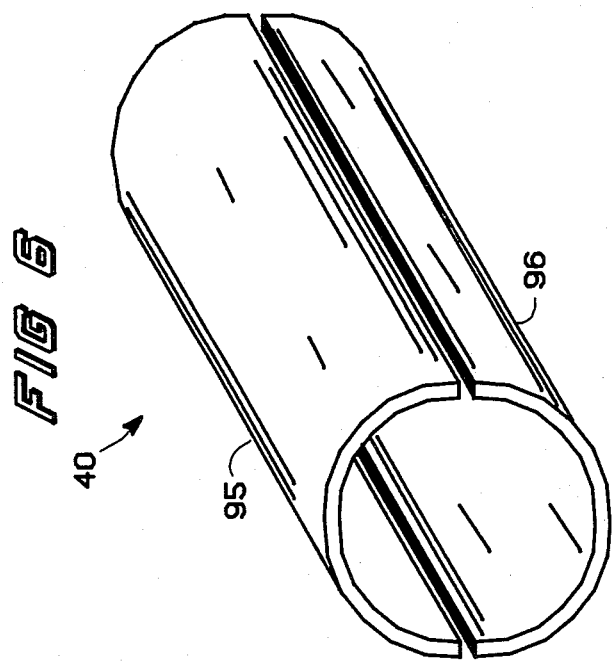
FIG. 6 illustrates a clam-shell substrate structure.

A plasma can be defined as an approximately neutral cloud of charged particles, formed, for example, by an electric glow discharge. The types and characteristics of plasmas vary widely depending on conditions; two types commonly of interest are denoted as the low pressure and high pressure plasmas. The boundary line which distinguishes between the two types of plasma is a pressure of about 100 torr ($1.33 \times 10^4$ pa), but for practical purposes the high pressure plasma (HPP) is typically produced at a pressure of about one atmosphere. An important distinction between low pressure and high pressure plasma relates to temperature: in a low pressure plasma the electron temperature can be much greater than the gas temperature; in contrast, the conditions found in a high pressure plasma lead to thermal equilibrium in which the electron and gas temperatures are nearly identical. The gas temperature in the high pressure plasma can typically reach 3000°–5000° K.

FIG. 1 illustrates an overall system for practice of the invention. The deposition reaction takes place within a reaction chamber 10 within which the atmosphere can be properly controlled. The reaction chamber is discussed in detail below. An output tube 18 terminates in a high pressure plasma (HPP) nozzle 20 from which a high pressure plasma 22 is directed. Tube 18 is the high voltage output from the impedance matching module 24. Energy from an RF generator 26 is conveyed to the impedance matching module by a coaxial cable 28. Also conveyed to the impedance matching module are two gas streams, an inner gas stream 30 and an outer gas stream 31. The gas streams are controlled by a gas control system 32. Piped to the gas control system are reactants including hydrogen 34 and a silicon source gas 36. This silicon source gas is preferably trichlorosilane but can also be selected from silicon tetrachloride, silicon tetrafluoride, other chlorosilanes, or other silicon bearing gases or mixtures thereof. An inert gas 38 such as helium is also piped to the gas control system.

FIG. 2 illustrates details of impedance matching module 24. The impedance matching module comprises a coil 42 and variable input and output capacitors 44, 46, respectively. RF power is conveyed to the module by coaxial cable 28. The coil is tuned to resonance by adjusting the input and output capacitors. At resonance, output tube 18 is tuned to a high voltage. Coil 42 is made of coaxial tubing and has an inner tube 48 to carry inner gas stream 30 and an outer tube 50 to carry outer gas stream 31 as shown in cross-section 2a. The inner and outer tubes are formed of a metal such as stainless steel which is chemically resistant to the silicon-bearing gas. The inner and outer gas streams are thus conveyed through the tuned coil to the high voltage output tube and then to the high pressure plasma nozzle 20. The high voltage present at output tube 18 and thus at nozzle 20 is sufficient to generate an RF discharge plasma at the nozzle tip.

A dual-flow high pressure plasma nozzle assembly is illustrated in more detail in FIG. 3. Output 18 of coil 42 with its concentric inner and outer tubes conveying two different gas streams is attached to nozzle 20. The nozzle is comprised of a metal shell 52 made of stainless steel or other chemically resistant metal. An inner electrode 54 is formed of a refractory metal such as molybdenum or tungsten. An insulator sheath 56 forms the end of the nozzle. The sheath is formed of an insulator such as boron nitride which has a high dielectric strength at the RF frequency and which is resistant to the chemical ambient. One of the reactant gases is conveyed through inner tube 48 to inner electrode 54. The second gas is conveyed through outer tube 50 and then through a plurality of ports 58 or openings which are bored through metal shell 52 and which are arranged concentrically about opening 60 into which inner tube 48 and inner electrode 54 are positioned. The nozzle thus permits the isolation of the two gas streams until they exit at the tip of the nozzle.

FIG. 4 schematically illustrates one embodiment of deposition reaction chamber 10. The chamber comprises a quartz enclosure 70, gas seals or curtains 80 at the reactor entrance and exit and an auxiliary resistance heated furnace 82. A finite length, thermal expansion, shear separation (TESS) substrate 40 is introduced into the reactor from the left through the gas seals and is withdrawn from the right along with deposited silicon 84. The HPP nozzle is positioned in the reactor through a high dielectric strength elastomer seal 86 which serves to center the nozzle in the chamber and to electrically isolate output tube 18 from the chamber and TESS substrate. Effluent gases from the reaction pass through an exhaust tube 88 to a chlorosilane and hydrogen recovery system (not shown) for subsequent separation and recycling.

The TESS substrate is maintained during deposition at a temperature greater than about 950° C. and preferably at about 1100° C. The enthalpy of the HPP gases provides about 25 to 50 percent of the required substrate heating. Substrate heater 82 supplies the remaining necessary heat energy and maintains the temperature at a constant selected deposition temperature.

Figure 5:
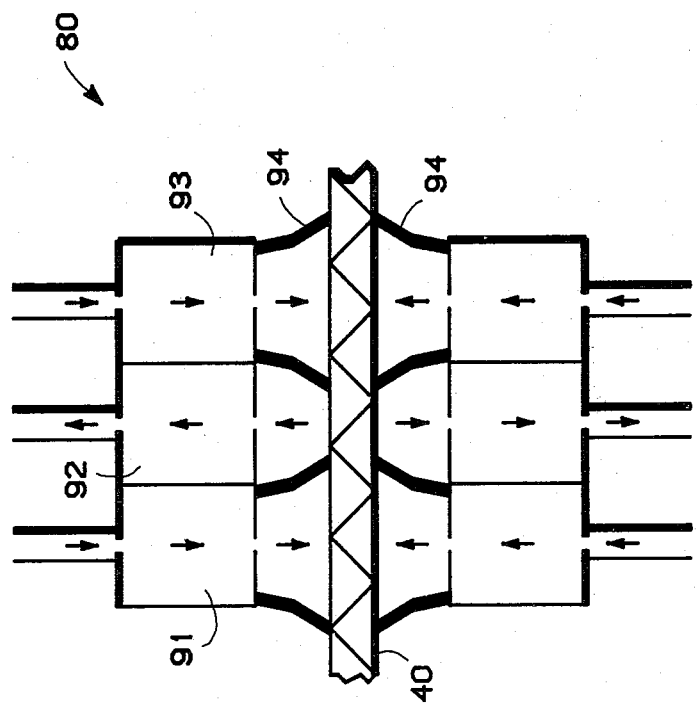
FIG. 5 illustrates a gas seal geometry suitable for sealing the entrance and exit of the HPP deposition system.

FIG. 5 illustrates one embodiment of a gas seal for use with the deposition reactor chamber described above. An O-ring seal 90 provides an airtight seal between gas seal 80 and quartz enclosure 70. Gas seal 80 comprises three sections 91, 92, 93. Sections 91 and 93 provide pressurized inert gas curtains which impinge upon the moving TESS substrate. The inert gas curtains are separated by a vacuum curtain provided by section 92. Flexible wipers 94 minimize the gas flow through the curtains, a necessary condition for adequate sealing. The inert gas curtain is achieved by forcing an inert gas such as nitrogen or argon through an opening or series of orifices. In a similar manner, gases are expelled through an opening or series of orifices in the vacuum portion 92 and are pumped out by a vacuum pump (not shown).

FIG. 6 illustrates one preferred embodiment for the TESS substrate. The substrate is of finite length and comprises two half cyclinders 95, 96 which together form the total cylinder 40. The split cylinder facilitates separation of the substrate from the silicon deposit.

The deposition reaction is carried out generally as follows to form a hollow cylindrical silicon deposit. Initially the reactor is loaded with a finite length TESS substrate positioned to extend from the gas seals at the left to the gas seals at the right. The gas seals are activated by initiating the gas and vacuum curtains and the reactor is purged with an inert gas such as helium to remove all air from the system. For this purge step the helium is directed through both the inner and outer coaxial tubes of coil 42 and output tube 18. The reactor is flushed with the helium and any air or other contaminants present in the system are removed at 88.

Hydrogen is then introduced into both inner and outer gas streams through the gas control system. The RF generator is turned on and the power is increased to a level suitable for creating a plasma. The input and output capacitors of the impedance matching module are tuned to resonance. Creation of a plasma beam at the dual-flow nozzle and a low reflected power measured at the RF generator are indications of resonance.

After the plasma is created, furnace power is turned on to heat the TESS substrate. When the furnace temperature reaches the deposition temperature (about 1100° C.), trichlorosilane or other silicon bearing gas is gradually introduced into the inner gas stream while gradually reducing the hydrogen flow in that stream. A change in the gas stream from hydrogen to trichlorosilane affects the tuning of the network; it is therefore necessary to simultaneously retune the impedance matching network to sustain the plasma. The flow rates of the two gases are adjusted to obtain the desired flow rate and mole ratio of the reactants. At this time, the TESS substrate translation from left to right is initiated at a rate compatible with the thickness of the silicon tube desired. The two reactants exit the high pressure plasma nozzle and the trichlorosilane reacts with the hydrogen; the extremely high temperatures resulting from the high pressure plasma favor the endothermic reduction reaction to produce solid silicon.

The silicon deposit is in the form of a hollow tube having an outer shape conforming to the shape of the TESS substrate. The thickness of the silicon deposit, that is the thickness of the cylinder wall, is determined by a number of variables including the translational speed of the TESS substrate through the deposition chamber. As the deposition is initiated, it is necessary to change the inner portion of the gas seal at the exhaust side of the chamber until the silicon tube diameter reaches a steady state value. Once the steady state value is reached, no change in seal is needed.

As the TESS substrate moves through the deposition chamber, silicon is deposited on the substrate from the high pressure plasma reaction. The substrate exiting the exhaust side of the chamber has a silicon deposit upon it having a uniform thickness; the deposition rate non-uniformities along the length of the deposition system, such as non-uniformities in furnace temperature, become averaged out over the term of the deposition.

As the TESS substrate with the silicon deposited upon it exits the deposition chamber the substrate and silicon deposit are separated by utilizing the difference in thermal expansion coefficient between the substrate and the silicon. As each length of TESS substrate exits the furnace it is removed from the silicon. The silicon itself, however, exits the gas seals as a continuous tube and is sawed into predetermined lengths. During the sawing operation, the deposition system is switched to a purging mode in which reactant flows and substrate translation are stopped and inert gas is substituted for the reactant hydrogen and silicon source gas. After removing the cut silicon portion, the exhaust seal is reinserted in the remaining silicon and the deposition cycle is reinitiated.

Polycrystalline silicon tubes so produced are useful, for example, as starting material for single crystal silicon growth by methods such as the Czochralski or float-zone techniques. Only a slight surface cleaning or etching is required. The deposited silicon is dense and continuous. If the substrate deposition temperature is not maintained above about 950° C., silicon is still deposited but the deposit is brown, flaky and porous.

After separation of the deposit from the TESS substrate, the reusable substrate is recycled and is reintroduced into the deposition chamber. The TESS substrate shell material is selected to have a thermal expansion coefficient significantly different from that of silicon with the shell having the smaller expansion coefficient and to be relatively unreactive with silicon at the deposition temperature. Suitable materials include molybdenum and tungsten. The difference in expansion coefficient and the minimal amount of reaction between substrate and silicon permits the ready separation of the two materials.

Reactor input gas composition and flow rate are preferably optimized to obtain high silicon throughput (amount of silicon deposited per minute) and high per pass conversion (amount of silicon gas converted to solid deposited silicon). In general, low silicon bearing gas concentrations and low total reactant flow rates result in high per pass conversion efficiency at the expense of silicon deposition throughput. High silicon gas concentrations and higher reactant flow rate, conversely, result in high throughput and low per pass conversion efficiency. In preferred reactions using $SiHCl_3$ or $SiCl_4$ as the silicon source gas composition is adjusted to about 7% $SiHCl_3$ in $H_2$, or about 5% $SiCl_4$ in $H_2$. The optimum total reactant flow rate depends on the reactor dimensions. For a reactor having a diameter of about 5 cm and a length of about 60 cm, a silicon deposition throughput of about 1.4 gm/minute and a per pass conversation efficiency of about 35% is achieved under the following conditions: 45 liters per minute hydrogen and 3.15 liters per minute $SiHCl_3$, 3 kw rf power for the high pressure plasma beam, and a deposition substrate temperature of about 1100° C. In comparison, prior art processes yield about the same throughput with only a 14% per pass conversion using 90 liters per minute of hydrogen and 9 liters per minute of $SiHCl_3$.

The higher per pass conversion efficiency for the process in accordance with the invention, apart from increasing the throughput of the HPP deposition system, also reduces expenses associated with the effluent recovery system. The HPP process achieves approximately 50% higher material utilization efficiency. For an identical amount of silicon produced, the HPP process requires approximately 20% less energy.

Thus there has been provided, in accordance with the invention, a process for the deposition of silicon in a high pressure plasma which fully meets the objects set forth above. While the invention has been described with regard to specific embodiments thereof, the invention is not to be so limited. Those skilled in the art will appreciate that modifications can be made, for example, in the deposition apparatus and the high pressure plasma nozzle design. Further, practice of the invention has been illustrated by the use of a cylindrical deposition surface. Other shapes can be used to achieve silicon bodies having ribbon-shapes, rectangular cross-section, or the like. Other similar variations and modifications will be apparent in light of the foregoing description. Accordingly, it is intended to embrace all such variations and modifications as fall within the scope of the appended claims.

We claim:

1. A process for depositing silicon in a plasma reactor apparatus which comprises the steps of: providing a substrate positioned in said reactor apparatus, said substrate heated to an elevated deposition temperature; providing a high pressure plasma nozzle for conveying separate gas streams; raising said high pressure nozzle to a high rf potential to initiate a high pressure plasma in said reactor apparatus; introducing hydrogen and silicon bearing reactant through said high pressure plasma nozzle to create a plasma of said hydrogen and said silicon bearing reactant; reacting said plasma of hydrogen and said silicon bearing reactant to deposit silicon on said substrate; removing said substrate from said reactor apparatus; and separating said silicon and said substrate.

2. The process of claim 1 wherein said substrate has the form of a hollow cylinder.

3. The process of claim 1 wherein said silicon bearing reactant is a chlorosilane.

4. The process of claim 1 wherein said silicon bearing reactant is silicon tetrachloride.

5. The process of claim 1 wherein said silicon bearing reactant is trichlorosilane.

6. The process of claim 1 wherein said substrate is heated to a temperature in excess of 950° C.

7. The process of claim 1 wherein said substrate and said silicon are separated by thermal expansion shear stress.

8. A process for depositing polycrystalline silicon which comprises the steps of: providing a reactor enclosure for controlling the reaction ambient; providing a substrate having a selected interior shape; providing sealing means for closing said enclosure, said sealing means allowing the passage therethrough of said substrate; providing means for generating a high pressure rf plasma; initiating a high pressure plasma, said high pressure plasma directed to the interior of said substrate; introducing reactants comprising hydrogen and a silicon bearing compound to said high pressure plasma and creating a high pressure rf plasma thereof, said high pressure plasma reactants interacting to deposit silicon on the interior of said substrate.

9. A process for depositing polycrystalline silicon which comprises the steps of: providing a reactor enclosure for controlling the reaction ambient; providing a substrate having a selected interior shape; providing sealing means for closing said enclosure, said sealing means allowing the passage therethrough of said substrate; providing means for generating a high pressure rf plasma; initiating a high pressure plasma, said high pressure plasma directed to the interior of said substrate; introducing reactants comprising hydrogen and a silicon bearing compound to said high pressure plasma, said reactants interacting in the presence of said high pressure plasma to deposit silicon on the interior of said substrate; and controllably moving said substrate through said reactor enclosure during the deposition of said silicon.

10. The process of claim 9 further comprising the step of separating said silicon from said substrate.

* * * * *